United States Patent
Wang et al.

(10) Patent No.: US 8,193,819 B2
(45) Date of Patent: Jun. 5, 2012

(54) METHOD AND APPARATUS FOR IMPROVING YIELD RATIO OF TESTING

(75) Inventors: Wei-Ping Wang, Miao-Li (TW); Hsuan-Chung Ko, Miao-Li (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 370 days.

(21) Appl. No.: 12/610,270

(22) Filed: Oct. 30, 2009

(65) Prior Publication Data
US 2010/0237879 A1 Sep. 23, 2010

(30) Foreign Application Priority Data
Mar. 20, 2009 (TW) ................ 98109158 A

(51) Int. Cl.
*G01R 27/28* (2006.01)
(52) U.S. Cl. ........................ 324/628; 324/627
(58) Field of Classification Search .......... 324/627, 324/628
See application file for complete search history.

(56) References Cited

U.S. PATENT DOCUMENTS

| 6,509,742 | B1 * | 1/2003 | Ebizuka et al. | 324/627 |
| 7,242,176 | B2 * | 7/2007 | Thomason | 324/96 |
| 7,595,646 | B2 * | 9/2009 | Hailey et al. | 324/627 |
| 2002/0190725 | A1 * | 12/2002 | Craven | 324/627 |

FOREIGN PATENT DOCUMENTS

| JP | 63043834 | | 2/1988 |
| JP | 2000266804 | | 9/2000 |
| KR | 1020030020964 | A | 3/2003 |

* cited by examiner

*Primary Examiner* — Amy He
(74) *Attorney, Agent, or Firm* — Stout, Uxa, Buyan & Mullins, LLP

(57) ABSTRACT

A method and apparatus for improving yield ratio of testing are disclosed. The method includes the following steps. First of all, devices are tested and electromagnetic interference is measured. Next, the test results are examined for whether the devices pass the test or not. Then, electromagnetic interference data are examined for whether the electromagnetic interference data are over a predetermined standard if the devices fail the test. The above-mentioned steps are performed again if the electromagnetic interference data are over a predetermined standard. The test is terminated if the devices still fail the test and the values of electromagnetic interference are still over a predetermined standard.

20 Claims, 6 Drawing Sheets

METHOD AND APPARATUS FOR IMPROVING YIELD RATIO OF TESTING

CROSS-REFERENCE TO RELATED APPLICATIONS

The entire contents of Taiwan Patent Application No. 098109158, filed on Mar. 20, 2009, from which this application claims priority, are incorporated herein by reference.

BACKGROUND OF THE INVENTION

1. Field of the Invention

The present invention relates to a method and apparatus for improving yield ratio of a testing device, and more particularly, to a method and apparatus for improving yield ratio of a testing radio frequency device.

2. Description of Related Art

Functions and electric properties of various integrated circuit chips (IC) such as radio frequency ICs, memory devices, consumer devices, logic and mixed signal ICs, image sensors and driver ICs must be tested and verified by a tester in order to insure their quality. The above-mentioned devices under test or DUTs are tested through test signals provided by the tester to verify the functions. However, DUTs are usually sensitive to high frequency electromagnetic interference, such as with radio frequency ICs, wireless LAN devices or cellular phone application devices. The testing of such radio frequency ICs, wireless LAN devices or cellular phone application devices specifically sensitive and susceptible to high frequency electromagnetic interference can result in alteration of test results. Particular instances in which high frequency electromagnetic interference can alter test results of the testing of these sensitive devices can involve the high frequency electromagnetic interference altering the judgment of the tester such that a DUT is placed in a fail bin rather than a pass bin, or vice versa, or can even result in incorrect marginal-fail decisions thus causing yield loss of testing quantity and reducing an efficiency of (e.g., wasting the time of) the work force.

In order to avoid such interference from the testing environment and resulting misjudgments of test results, the interference from a given testing environment is usually checked before testing. Uses of wireless communication equipment are restricted and other outside influences are removed or adjusted before testing. However, such acts cannot immediately resolve the problems resulting from unpredictable electromagnetic interference since the strength and influence of electromagnetic waves tend to vary with location and time. Such unpredictable electromagnetic interference problems can also introduce uncertainty as to yield loss of testing or even if there is any yield loss of testing. In such circumstances, it is hard to estimate how much yield loss of testing is caused by electromagnetic interference when electromagnetic interference is present and to timely exclude the electromagnetic interference. Since yield loss of testing caused by electromagnetic interference can be difficult to estimate, yield loss recovery evaluation can also be difficult to perform.

In order to solve the above-mentioned problems, the invention provides a method and apparatus for improving yield ratio of testing devices to avoid error resulting from electromagnetic interference of the environment and timely resolve the yield loss of testing caused by unpredictable electromagnetic interferences so as to improve the efficiency and yield ratio of testing and decrease the cost of testing.

SUMMARY OF THE INVENTION

An object of the present invention is to provide a method and apparatus for improving yield ratio of testing to avoid the error resulting from electromagnetic interference of environment and timely resolve the yield loss of testing caused by unpredictable electromagnetic interferences, so as to improve the efficiency and yield ratio of testing and to decrease the cost of testing.

According to the object, one embodiment of the present invention provides a method for improving yield ratio of testing. The method comprises the following steps. First of all, a test of a device and measurement of electromagnetic interferences is performed. Then, whether the device passes the test or not is determined. Next, whether values of the electromagnetic interference are over a predetermined standard value or not is determined if the device fails the test. The above steps are performed again if the values of the electromagnetic interference are over the predetermined standard value. The test is terminated if the device fails the test and the values of the electromagnetic interference are over the predetermined standard value.

The invention provides a test apparatus (e.g., device) for improving yield ratio of testing. The test apparatus comprises a test procedure module in a tester and an interference-receiving module. The interference-receiving module receives electromagnetic interferences and transmits values of the electromagnetic interference to the tester, wherein the test procedure module determines whether the electromagnetic interferences will or is likely to affect a testing result of devices under test.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

DESCRIPTION OF THE PREFERRED EMBODIMENT

A detailed description of the present invention will be provided in the context of the following embodiments, which are not intended to limit the scope of the present invention and which can be adapted for other applications. While drawings are illustrated in detail, it is appreciated that the scale of each component may not be expressed exactly.

Figure 1:
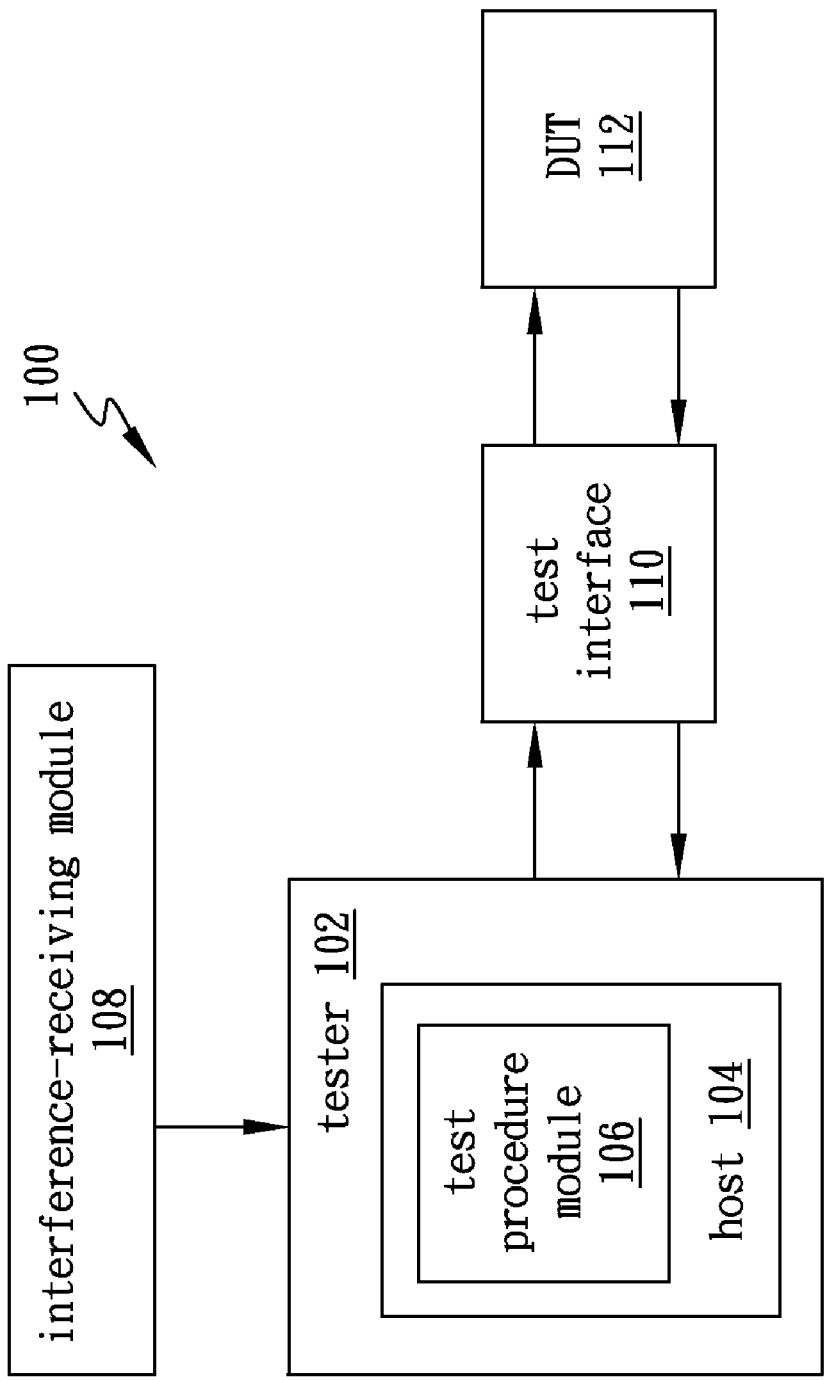
FIG. 1 shows one embodiment of a test system for improving yield ratio of testing in accordance with the invention.

FIG. 1 shows one embodiment of a test system for improving yield ratio of testing in accordance with the invention. The test system 100 comprises a tester 102, an interference-receiving module 108, and a test interface 110. The tester 102 comprises a host 104. The host 104 comprises a control unit including a central processing unit, data storing media comprising hard disks, and memory devices. The host 104 is the center of control and management for handling all test activities of the system 100 including the generation and transmission of test signals, control of a handler to pick up and place and to sort devices under test, and determinations of pass or failure of the devices under test according to the test signals. The host 104 comprises a test procedure module 106. The test procedure module 106 includes a central processing unit, a computer readable medium storing processor executable instructions or programs, and instructions or programs stored on the computer readable medium operable to perform the method for improving yield ratio of testing of the invention. The computer readable medium comprises, but is not limited to, hard disks and memory devices. The programming language of the instructions or programs stored on the computer readable medium operable to perform the method for improving yield ratio of testing of the invention includes but is not limited to C/C++. The interference-receiving module 108 connects to the tester 102 to receive electromagnetic interference noises (i.e./e.g., interference(s)) and transmits the electromagnetic interference noises to the tester 102. The host 104 and the test procedure module 106 determine whether the electromagnetic interference noises affect the testing result of the devices under test. The test interface 110 includes a device under test board(DUT board) or a load board as the interface of signal transmission between the tester 102 and the devices under test 112. The devices under test 112 comprise, but are not limited to, WLAN 802.11a/b/g/n devices, RF devices, cellular phone application devices such as GPRS, CDMA and Bluetooth devices.

Figure 2:
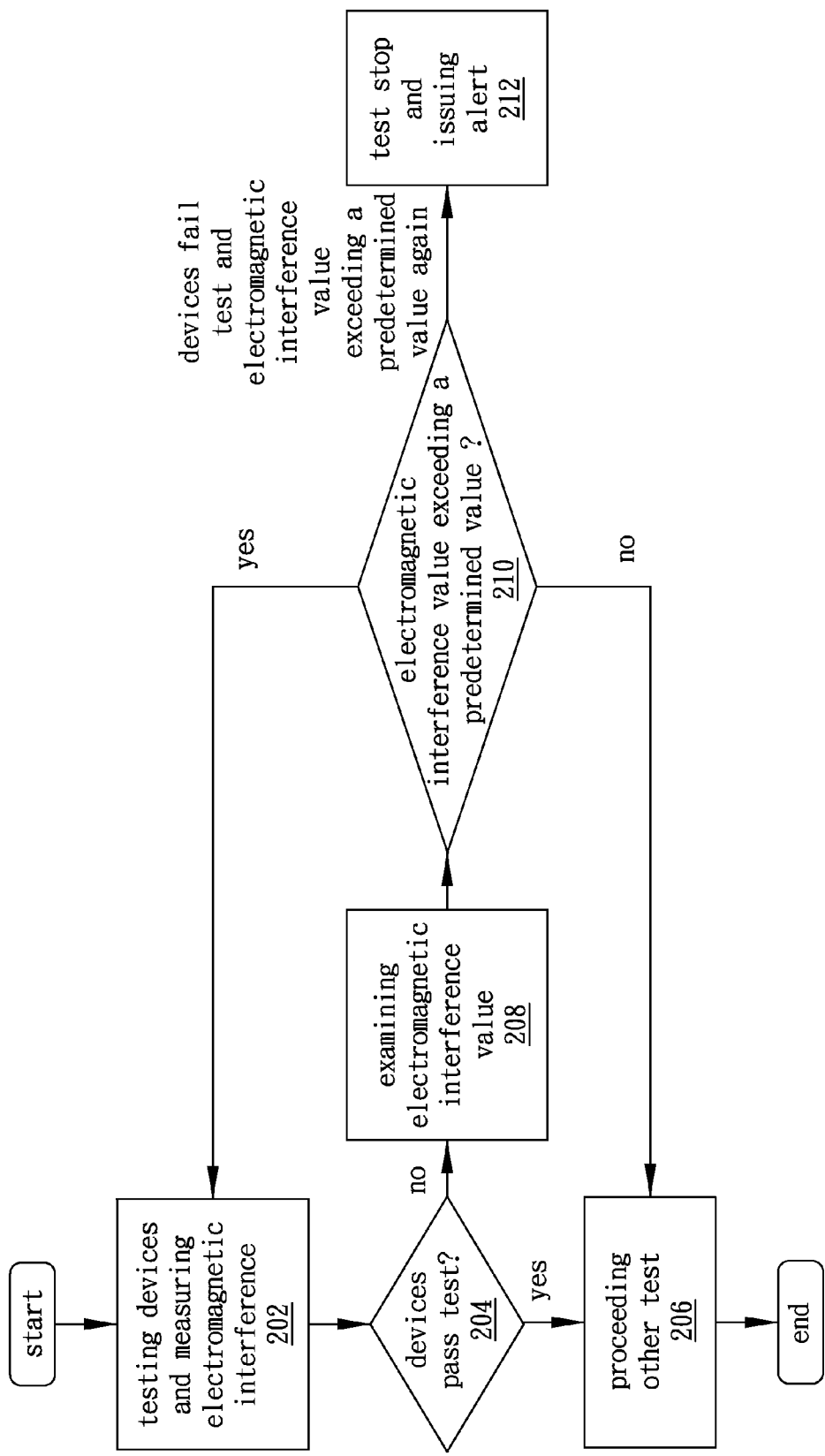
FIG. 2 shows one embodiment of a method for improving yield ratio of testing according to the invention.

FIG. 2 shows an embodiment of a method for improving yield ratio of testing according to the invention. In one embodiment, as performed in the test system 100 shown in FIG. 1, the tester 102 controls a handler (not shown) to pick and place the devices under test 112 onto the test interface 110. The tester 102 transmits test signals to the devices under test 112 through the test interface 110 so as to test the devices 112. The interference-receiving module 108 detects and receives electromagnetic interference noises and transmits the electromagnetic interference noises or data to the tester 102, as block 202 in FIG. 2, devices are tested and electromagnetic interferences (i.e./e.g., interference(s)) are measured. The test items depend on the specifications of the devices under test 112 or the demand of the customer. The test items include, but are not limited to, error vector magnitude (EVM), bit error rate(BER), signal to noise ratio(S/N) and noise value. In order to receive and measure the electromagnetic interferences, the interference-receiving module 108 is set to receive the frequency band of the devices under test 112. Next the tester 102 determines whether the devices pass the test or not according to the test signals transmitted from the devices under test 112 through the test interface 110, as block 204. The tester 102 proceeds to other test(s) if the tester 102 determines that the devices under test 112 pass the test according to predetermined standard(s), as block 206. The tester 102 examines the values or data of the electromagnetic interferences transmitted from the interference-receiving module 108 if the tester 102 determines that the devices under test 112 fail the test according to predetermined standard, as block 208. Then the tester 102 examines and determines whether the values or data of the electromagnetic interferences transmitted from the interference-receiving module 108 exceed a predetermined value, as block 210. The tester 102 determines that the devices under test 112 fail the test due to self-failure of the devices under test and proceeds to other tests if the values or data of the electromagnetic interferences transmitted from the interference-receiving module 108 do not exceed a predetermined value. The tester 102 tests the devices under test and the interference-receiving module 108 measures electromagnetic interferences again if the values or data of the electromagnetic interferences transmitted from the interference-receiving module 108 exceed the predetermined value. Then the tester 102 determines whether the devices pass the test or not according to the test signals transmitted from the devices under test 112 through the test interface 110 again. Next the tester 102 proceeds to other tests if the tester 102 determines that the devices under test 112 pass the test according to predetermined standard. The tester 102 examines the values or data of the electromagnetic interferences transmitted from the interference-receiving module 108 if the tester 102 determines that the devices under test 112 fail the test according to predetermined standard again. The tester 102 proceeds to other tests if the tester 102 determines that the devices under test 112 pass the test according to predetermined standard again. The tester 102 examines the values or data of the electromagnetic interferences transmitted from the interference-receiving module 108 if the tester 102 determines that the devices under test 112 fail the test according to predetermined standard again. The tester 102 determines that the devices under test 112 fail the test due to self-failure of the devices under test and proceeds to other tests if the values or data of the electromagnetic interferences transmitted from the interference-receiving module 108 do not exceed a predetermined value again. The tester 102 stops testing and controls a handler to cause/provide an alert if tester 102 determines that the devices under test 112 fail the test and the values or data of the electromagnetic interferences transmitted from the interference-receiving module 108 exceed a predetermined value again, as block 212.

Figure 3A:
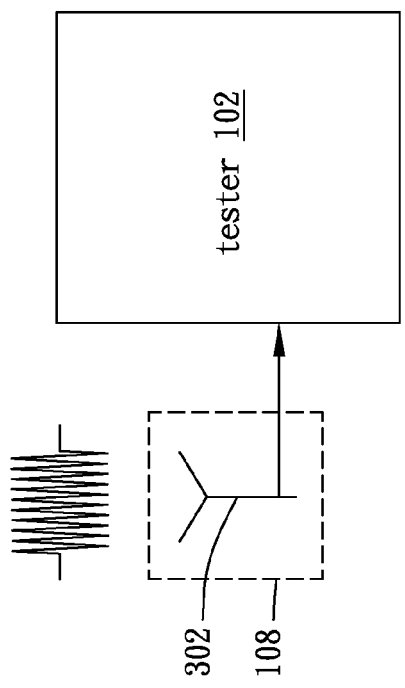
FIGS. 3A and 3B show two preferred embodiments of the interference-receiving module of the invention.
Figure 3B:
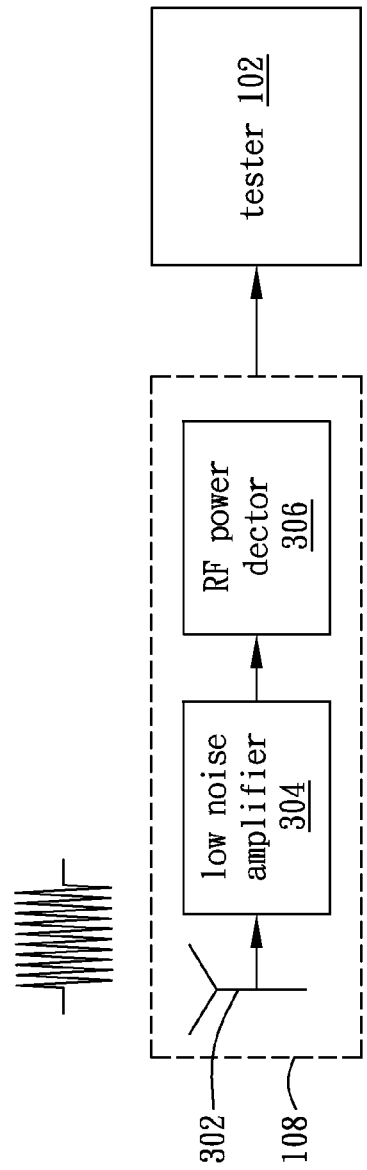
Figure 4:
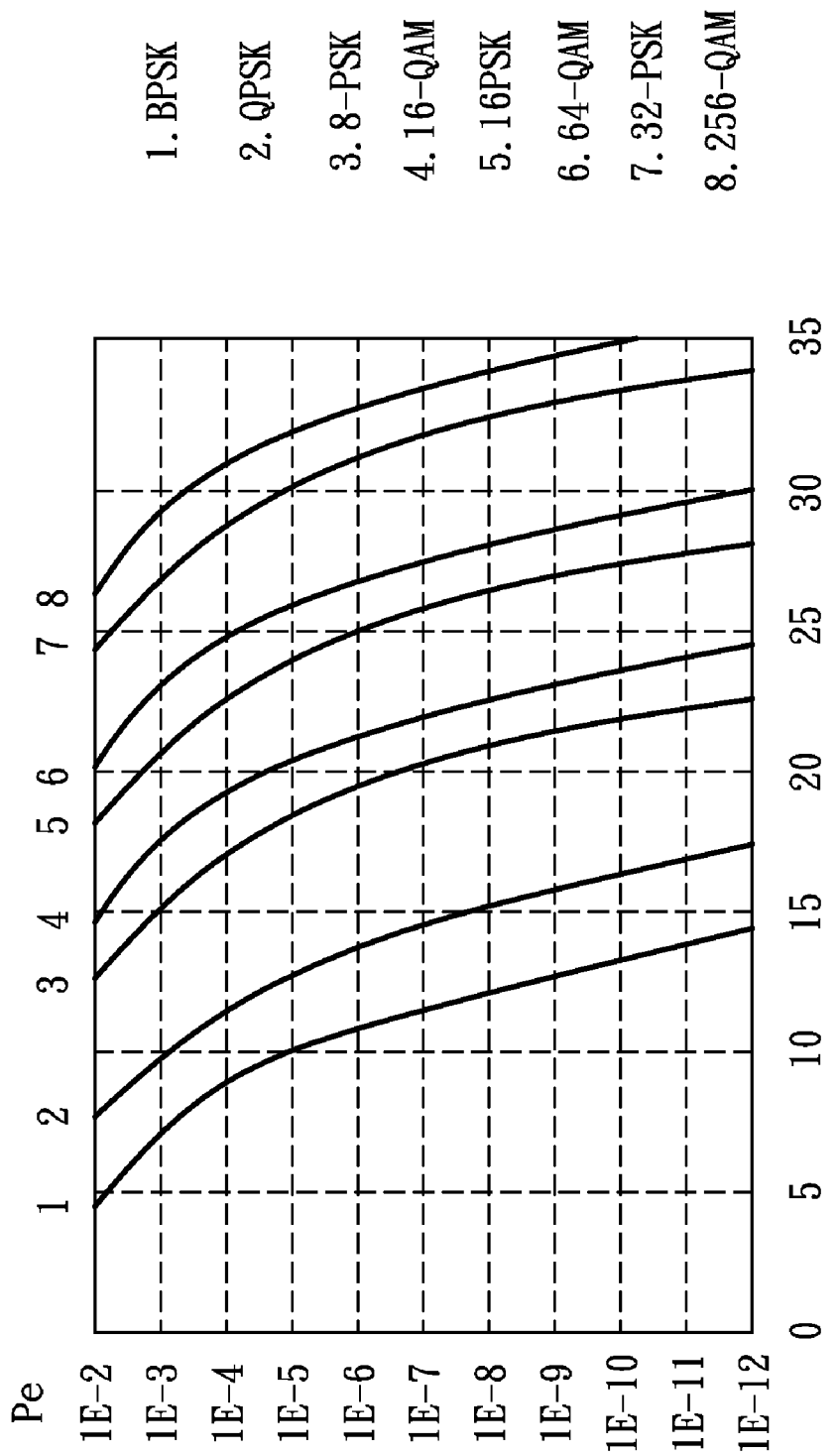
FIG. 4 shows a diagram of carrier to noise(C/N) versus bit error rate(BER).

FIGS. 3A and 3B show two preferred embodiments of the interference-receiving module of the invention respectively. In the embodiment of FIG. 3A, the interference-receiving module 108 comprises an antenna module 302. The antenna module 302 includes dipole antennas with operating frequency corresponding to the frequency band of the devices under test. The antenna module 302 transmits electromagnetic interference signals, noises or data to the tester 102 via RF ports of the tester 102. FIG. 4 shows a diagram of carrier to noise(C/N)versus bit error rate(BER). The electromagnetic interference noise is transmitted from a personal handyphone system(PHS), the frequency is 1900 MHz and the testing item is bit error rate. The electromagnetic interference noise detected by the antenna module 302 can be used as background noise of the device under test. The electromagnetic interference noise would increase the bit error rate of the device under test. The bit error rate resulting from the electromagnetic interference noise can be obtained through FIG. 4 if the modulation system, C of carrier and N of electromagnetic interference noise, are known or measured. The real bit error rate of the device under test can be obtained by calculating the difference between the measured bit error rate of the device under test and the bit error rate resulting from the electromagnetic interference noise so that one can exclude the effect of the electromagnetic interference noise on the measure of the bit error rate. The modulation systems in FIG. 4 includes Phase Shift Keying(PSK), Quadrature Amplitude Modulation(QAM), Binary Phase Shift Keying(BPSK), Quadrature Phase Shift Keying(QPSK), 8PSK, 16PSK, 32PSK, 16 QAM, 64 QAM and 256 QAM.

Figure 5:
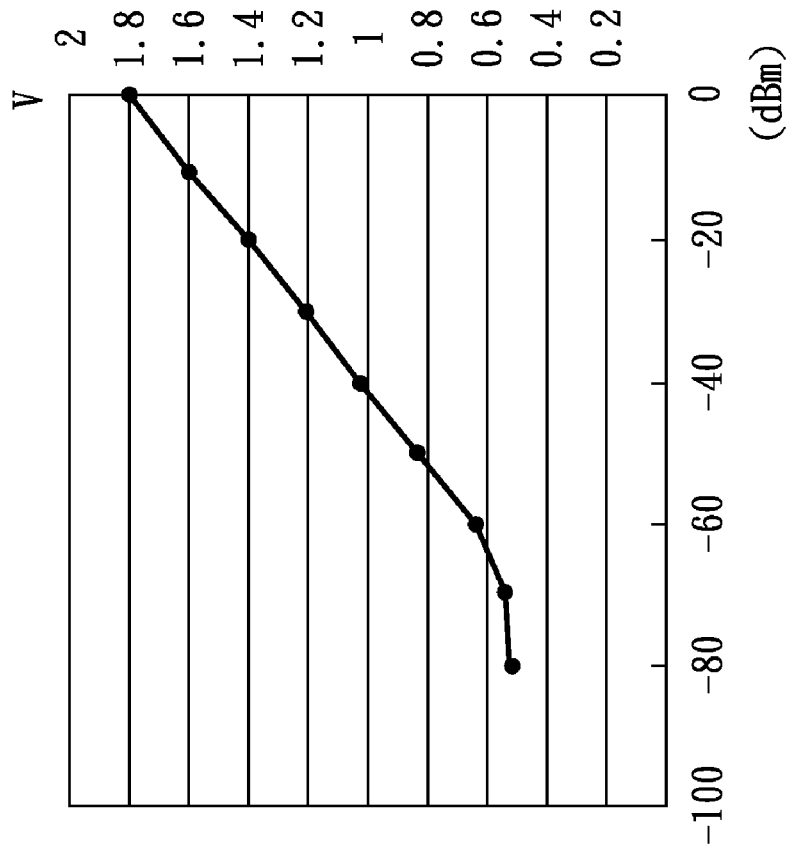
FIG. 5 shows a diagram of the RF signals versus DC voltage signals.

FIG. 3B shows another one of the preferred embodiments of the interference-receiving module of the invention. In the embodiment of FIG. 3B, the interference-receiving module 108 comprises an antenna module 302, a low noise amplifier 304, and a RF power detector 306. The antenna module 302 includes dipole antennas with operating frequency corresponding to the frequency band of the devices under test. The low noise amplifier 304 amplifies and transmits RF signals to the RF power detector 306. The low noise amplifier 304 can be omitted. The RF power detector 306 transforms the received RF signals to DC voltage signals and transmits them to the tester 102. FIG. 5 shows a diagram of the RF signals versus DC voltage signals. In FIG. 5, the RF signals could be electromagnetic interference noise when the DC voltage signals are over 0.6V. The measurement of the DC voltage signal can be performed by the following two methods:

(a) Performing progressive average calculations using a VI measurement instrument.

Figure 6:
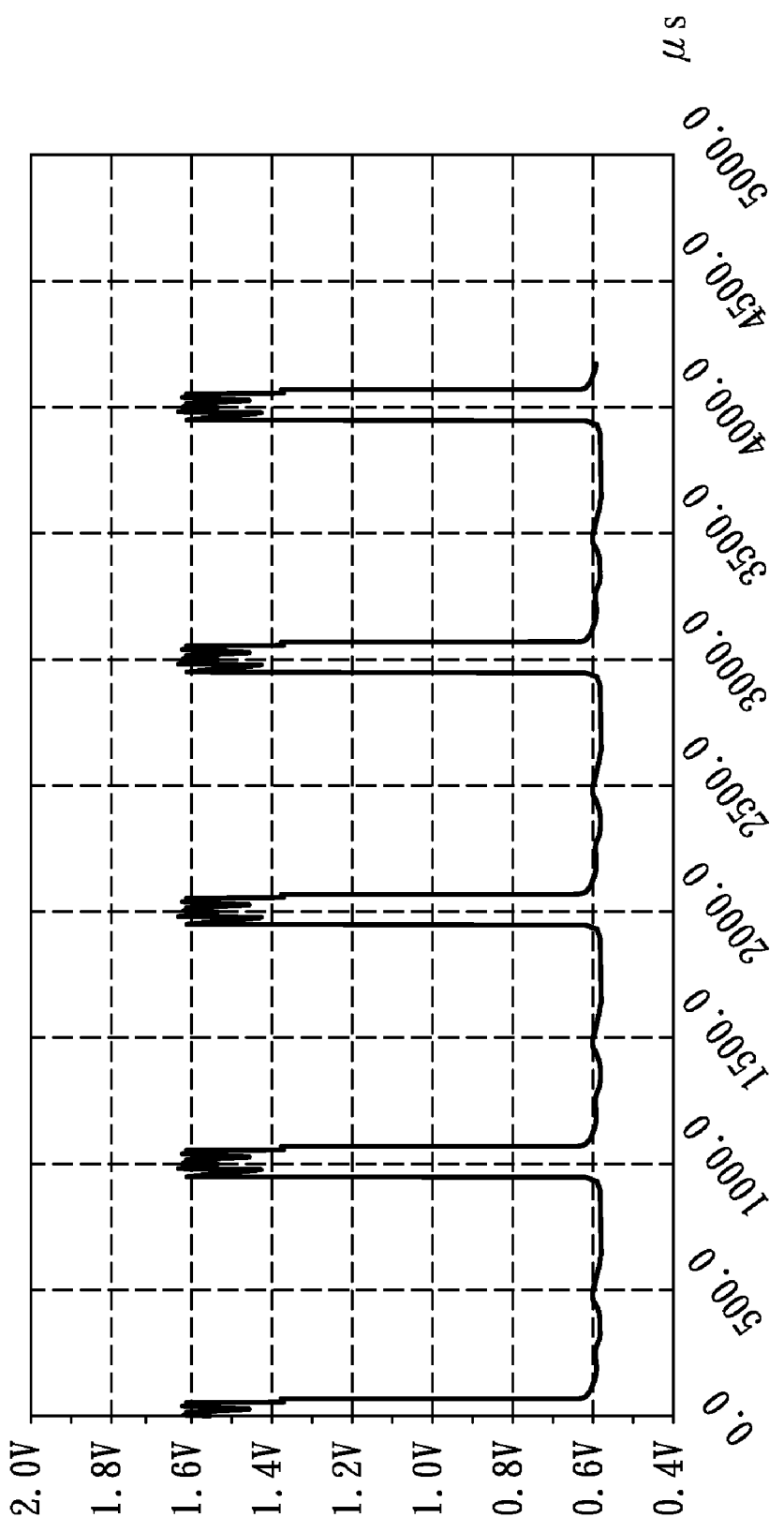
FIG. 6 shows a diagram of DC voltage signals transformed from the received RF signals versus time.

(b) Performing function test using a tester, wherein DC voltage signals transformed from the received RF signals are transmitted to the tester through I/O pin(s) of the tester. FIG. 6 shows a diagram of DC voltage signals transformed from the received RF signals versus time. In FIG. 6, the peak values of DC voltage signals last for 577 μs. The function test can be performed by setting threshold voltage as 1.0V for 1 μs. By using the threshold voltage comparing to low, the existence of electromagnetic interference can be detected. The function test performed on the tester can be performed together with regular test item(s) to monitor electromagnetic interferences so that the resource of testing equipment and testing time can be saved.

The invention utilizes a tester, an interference-receiving module, and a test interface to test RF devices. A test procedure module of a host of the tester performs a method for improving yield ratio of testing to avoid test errors resulting from electromagnetic interferences. The method and system can timely detect yield loss of testing caused by unpredictable electromagnetic interferences so as to improve yield ratio of testing and decrease the cost of device testing.

Although specific embodiments have been illustrated and described, it will be appreciated by those skilled in the art that various modifications may be made without departing from the scope of the present invention, which is intended to be limited solely by the appended claims.

What is claimed is:

1. A method for improving yield ratio of testing, said method comprising;
    (a) performing a test of a device and measurement of electromagnetic interferences;
    (b) determining whether the device passes the test or not;
    (c) determining whether values of the electromagnetic interference are over a predetermined standard value or not if the device fails the test;
    (d) performing (a) to (c) if the values of the electromagnetic interference are over the predetermined standard value; and
    (e) terminating the test if the device fails the test and the values of the electromagnetic interference are over the predetermined standard value.

2. The method according to claim 1, wherein the test of the device and measurement of electromagnetic interference are performed by a tester and an interference-receiving module respectively, and the interference-receiving module receives the electromagnetic interference and transmits the values of the electromagnetic interference to the tester.

3. The method according to claim 1, wherein other tests are performed if the device passes the test.

4. The method according to claim 1, wherein other tests are performed if the device fails the test and the values of the electromagnetic interference are not over the predetermined standard value.

5. The method according to claim 1, wherein step (e) further comprises alerting a handler controlled by the tester.

6. A test apparatus for improving yield ratio of testing, said test apparatus comprising:
    a test procedure module in a tester; and
    an interference-receiving module, the interference-receiving module receiving electromagnetic interference and transmitting values of the electromagnetic interference to the tester, wherein the test procedure module determines whether the electromagnetic interference affects a testing result of devices under test via performing a method for improving yield ratio of testing, the method comprising:
       (a) performing a test of a device and measurement of electromagnetic interferences;
       (b) determining whether the device passes the test or not;
       (c) determining whether values of the electromagnetic interference are over a predetermined standard value or not if the device fails the test;
       (d) performing (a) to (c) if the values of the electromagnetic interference are over the redetermined standard value; and
       (e) terminating the test if the device fails the test and the values of the electomagnetic interference are over the predetermined standard value.

7. The test apparatus according to claim 6, wherein the test procedure module comprises a computer readable medium storing processor executable instructions operable to determine whether the electromagnetic interference affects a testing result of devices under test.

8. The test apparatus according to claim 6, wherein the test procedure module comprises a computer readable medium storing processor executable instructions operable to perform the method for improving yield ratio of testing.

9. The test apparatus according to claim 6, wherein the interference-receiving module comprises an antenna module.

10. The test apparatus according to claim 9, wherein the antenna module transmits electromagnetic interference signals to the tester via RF ports of the tester.

11. The test apparatus according to claim 9, wherein the interference-receiving module further comprises a RF power detector, and the RF power detector transforms received RF signals to DC voltage signals and transmits them to the tester.

12. The test apparatus according to claim 11, wherein the interference-receiving module further comprises a low noise amplifier, and the low noise amplifier amplifies and transmits the received RF signals to the RF power detector.

13. A test system for improving yield ratio of testing, said test system comprising:
    a tester;
    a test interface, the tester transmitting test signals to devices under test through the test interface so as to test the devices; and
    an interference-receiving module, the interference-receiving module receiving electromagnetic interference and transmitting values of the electromagnetic interference to the tester, wherein the tester determines whether the electromagnetic interference affects a testing result of devices under test through performing a method for improving yield ratio of testing, the method comprising:
       (a) performing a test of a device and measurement of electromagnetic interferences;
       (b) determining whether the device passes the test or not;
       (c) determining whether values of the electromagnetic interference are over a predetermined standard value or not if the device fails the test;
       (d) performing (a) to (c) if the values of the electromagnetic interference are over the predetermined standard value; and (e) terminating the test if the device fails the test and the values of the electromagnetic interference are over the redetermined standard value.

14. The test system according to claim 13, wherein the tester comprises a test procedure module, the test procedure module determines whether the electromagnetic interference affects a testing result of devices under test.

15. The test system according to claim 14, wherein the test procedure module comprises a computer readable medium storing processor executable instructions operable to determine whether the electromagnetic interference affects a testing result of devices under test.

16. The test system according to claim 14, wherein the test procedure module comprises a computer readable medium storing processor executable instructions operable to perform the method for improving yield ratio of testing.

17. The test system according to claim 16, wherein the interference-receiving module comprises an antenna module.

18. The test system according to claim 17, wherein the antenna module transmits electromagnetic interference signals to the tester via RF ports of the tester.

19. The test system according to claim 17, wherein the interference-receiving module further comprises a RF power detector, and the RF power detector transforms received RF signals to DC voltage signals and transmits them to the tester.

20. The test system according to claim 19, wherein the interference-receiving module further comprises a low noise amplifier, and the low noise amplifier amplifies and transmits the received RF signals to the RF power detector.

* * * * *